United States Patent
Chen et al.

(10) Patent No.: US 8,662,950 B2
(45) Date of Patent: Mar. 4, 2014

(54) WHITE-LIGHT EMITTING DEVICE AND PREPARATION METHOD AND APPLICATION OF THE SAME

(71) Applicants: Yi-Jung Chen, New Taipei (TW); Chih-Chieh Yang, New Taipei (TW); Chin-Chang Shen, New Taipei (TW); Ru-Shi Liu, New Taipei (TW)

(72) Inventors: Yi-Jung Chen, New Taipei (TW); Chih-Chieh Yang, New Taipei (TW); Chin-Chang Shen, New Taipei (TW); Ru-Shi Liu, New Taipei (TW)

(73) Assignee: Everlight Electronics Co., Ltd. (TW)

(*) Notice: Subject to any disclaimer, the term of this patent is extended or adjusted under 35 U.S.C. 154(b) by 0 days.

(21) Appl. No.: 13/651,069

(22) Filed: Oct. 12, 2012

(65) Prior Publication Data
US 2013/0045655 A1 Feb. 21, 2013

Related U.S. Application Data

(63) Continuation of application No. 12/898,169, filed on Oct. 5, 2010, now Pat. No. 8,314,543.

(30) Foreign Application Priority Data

Oct. 5, 2009 (TW) .............................. 98133708 A

(51) Int. Cl.
*H01L 51/56* (2006.01)
*H01L 51/54* (2006.01)

(52) U.S. Cl.
USPC ............ 445/23; 445/24; 445/25; 252/301.27

(58) Field of Classification Search
USPC ........... 445/23–25; 313/498–512; 252/301.27
See application file for complete search history.

(56) References Cited

U.S. PATENT DOCUMENTS

| | | | |
|---|---|---|---|
| 6,252,254 B1 * | 6/2001 | Soules et al. | 257/89 |
| 6,337,536 B1 | 1/2002 | Matsubara et al. | |
| 6,730,942 B2 | 5/2004 | Mabuchi et al. | |
| 2004/0063372 A1 | 4/2004 | Liu et al. | |
| 2007/0159062 A1 | 7/2007 | Tsai et al. | |
| 2007/0202038 A1 * | 8/2007 | Yaghi et al. | 423/702 |

FOREIGN PATENT DOCUMENTS

| | | |
|---|---|---|
| CN | 2395133 | 9/2000 |
| CN | 1485931 | 3/2004 |
| CN | 1855558 | 11/2006 |
| EP | 1013740 A2 | 6/2000 |
| EP | 1447853 A1 | 8/2004 |
| EP | 1830415 A1 | 9/2007 |
| JP | 2-176760 | 7/1990 |
| TW | 146047 | 11/1990 |
| TW | 200802951 | 1/2008 |
| TW | 200842182 | 11/2008 |

* cited by examiner

*Primary Examiner* — Karabi Guharay
*Assistant Examiner* — Nathaniel Lee
(74) *Attorney, Agent, or Firm* — Han IP Corporation

(57) ABSTRACT

A white-light emitting device and its preparation method are provided. The white-light emitting device comprises an ultraviolet (UV) light emitting diode (LED) chip, a first phosphor, and a second phosphor, wherein the UV LED chip generates a first radiation; the first phosphor is composed of $Zn(C_3N_2H_4)_2$ powder and is excited by the first radiation to generate a second radiation; and the second phosphor is excited by the first radiation and/or the second radiation to generate a third radiation. The third radiation is then mixed with the first radiation and/or the second radiation to generate a white light.

20 Claims, 4 Drawing Sheets

WHITE-LIGHT EMITTING DEVICE AND PREPARATION METHOD AND APPLICATION OF THE SAME

CROSS-REFERENCE TO RELATED APPLICATIONS

This application is a continuation of U.S. patent application Ser. No. 12/898,169, filed on Oct. 5, 2010, which claims the priority benefit of Taiwan Patent Application No. 098133708, filed on Oct. 5, 2009. The above-identified applications are herein incorporated by reference in their entirety.

BACKGROUND

1. Technical Field

The present invention provides a light emitting device and a preparation method of the same. In particular, the present invention provides a white-light emitting device and a preparation method of the same.

2. Description of the Related Art

White light is a mixed light comprised of many colors. The light sensed by a human eye as white light comprises a mixed light of at least two wavelengths. For example, when a human eye is exposed to red, blue and green lights at the same time, or perceives blue and yellow lights at the same time, the eye perceives a white light. Thus, a white light emitting diode (LED) can be made according to this principle.

White light LEDs have been one of the most important and valued products in the world. Compared to conventional incandescent light bulbs, white light LEDs have the advantages of such as small in volume, emit no thermal radiation, consume low power, long service life and good reaction speed, and provide resolutions for many problems which were difficult for the incandescent light bulb to overcome in the past.

Accordingly, developed countries such as Europe, America, and Japan use white light LEDs as a new light source in the 21st century based on the common consensus of saving energy and protecting the environment. In Taiwan, about 11 billion kilowatts-hour of the power can be saved per year if a quarter of incandescent light bulbs and all fluorescent lamps are replaced by white light LEDs, which almost equals the yearly power generation of a nuclear power station. In view of this, it is clear that the benefit obtained from the development of white light LEDs is incredible. Therefore, developed countries such as Europe, America, and Japan have been invested a lot of manpower in the development of white light LEDs. It is expected that conventional lighting apparatuses will be replaced by white light LEDs in the following ten years.

The preparation method for white light LEDs was first developed by the Nichia Corporation, which mixed light of two wavelengths. In this method, a layer of yttrium aluminum garnet phosphor was coated on a blue light LED having a primary light emitting wavelength of 460 nm, and then the yttrium aluminum garnet phosphor was excited by the blue light LED to generate a yellow light having a primary wavelength of 555 nm, which is a complementary light of the blue light. The complementary lights, i.e., the yellow and the blue lights were mixed through the lens theory to obtain the desired white light.

Many people in the lighting industry are invested in developing a tri-wavelength light because the patent of the aforesaid preparing method is held by Nichia Corporation. The three primary color phosphors of blue, green, and red lights are excited by the UV light provided by an inorganic UV LED chip to generate the tri-wavelength light. If the ratio of the generated three primary color lights is exact, then the mixed light thereof will be a white light. However, to excite the various phosphors to generate fluorescence at the same time, one prerequisite condition is that the selected exciting light source must be absorbed by the fluorescence; the difference of the absorption coefficient for the exciting light between the phosphors cannot be too much; and the quantum efficiency of the photon conversion of the phosphors should also be as similar as possible. Obviously, the species of proper fluorescence materials are very limited. In addition to the difficult material selection, the color mixing equation for using three (or more) phosphors is a non-linear equation of second-order or more, based on the color mixing principle. In other words, its color change rate is two-dimensional or more than two-dimensional, and therefore, adjusting the ratio of the three primary color phosphors to obtain the white light is more difficult in technique.

In view of this, the present invention provides a white-light emitting device and a method for preparing the same, wherein only two species of phosphors are used to provide the desired white light.

SUMMARY

An objective of the present invention is to provide a white-light emitting device, comprising an ultraviolet (UV) light emitting diode (LED) chip for generating a first radiation; a first phosphor being composed of $Zn(C_3N_2H_4)_2$ powders, wherein the first phosphor is excited by the first radiation and transforms a part of the first radiation into a second radiation having a longer wavelength; and a second phosphor, which is excited by the first radiation and/or the second radiation to generate a third radiation; and the third radiation is then mixed with the first radiation and/or the second radiation to generate a white light.

Another objective of the present invention is to provide a method for preparing the aforesaid white-light emitting device, comprising the following steps: providing an UV LED chip for generating a first radiation; providing a first phosphor and a second phosphor; and mixing the first phosphor and the second phosphor; wherein the first phosphor is composed of $Zn(C_3N_2H_4)_2$ powders and is excited by the first radiation to generate a second radiation; the second phosphor is excited by the first radiation and/or the second radiation to generate a third radiation; and the third radiation is mixed with the first radiation and/or the second radiation to generate a white light.

According to one aspect, a method for preparing a white-light emitting device may comprise: providing an UV LED chip that generates a first radiation; providing a first phosphor and a second phosphor; and mixing the first phosphor and the second phosphor. The first phosphor may be composed of $Zn(C_3N_2H_4)_2$ powder and may generate a second radiation when excited by the first radiation. The second phosphor may generate a third radiation when excited by either or both of the first radiation and the second radiation. The third radiation may be mixed with either or both of the first radiation and the second radiation to generate a white light.

In at least some embodiments, the $Zn(C_3N_2H_4)_2$ powder may be prepared by a hydrothermal method. In at least some embodiments, the hydrothermal method may be performed in a sealed reactor at about 130° C. to about 250° C.

In at least some embodiments, the $Zn(C_3N_2H_4)_2$ powder may be prepared by a hydrothermal method, a solid-gaseous sintering method, a sol-gel method, a direct reaction method, or an organic metal thermal decomposition method. In at least some embodiments, the $Zn(C_3N_2H_4)_2$ powder may be prepared by the hydrothermal method at about 130° C. to about 250° C.

In at least some embodiments, the second phosphor may be prepared by one of a chemical synthesis method, a solid-gaseous sintering method, a sol-gel method, a direct reaction method, or an organic metal thermal decomposition method.

In at least some embodiments, the second phosphor may comprise: at least one element selected from a group consisting of Be, Mg, Ca, Sr, and Ba; at least one element selected from a group consisting of C, Si, Ge, Sn, Ti, Zr, and Hf; and an activator selected from rare earth elements.

In at least some embodiments, the activator may comprise europium (Eu) ion.

In at least some embodiments, the second phosphor may be represented by the formula of $MSiO_4$:R or $MSi(OCl)_4$:R, where M may be at least one II-group element selected from a group consisting of Ca, Sr, and Ba, and R may be Eu ion.

In at least some embodiments, the second phosphor may comprise $(SrBa)_2SiO_4$:$Eu^{2+}$ or $(SrBa)_2Si(OCl)_4$:$Eu^{2+}$.

In at least some embodiments, the second phosphor may be prepared by a hydrothermal method, a chemical synthesis method, a solid-gaseous sintering method, a sol-gel method, a direct reaction method, or an organic metal thermal decomposition method.

In at least some embodiments, a weight ratio of the first phosphor and the second phosphor may be in a range from about 1:2 to about 1:6.

In at least some embodiments, the weight ratio of the first phosphor and the second phosphor may be about 1:4.

In at least some embodiments, a color temperature of the white light may be about 6,000K to about 7,500K.

In at least some embodiments, a wavelength of the first radiation may be about 350 nm to about 430 nm In at least some embodiments, a wavelength of the second radiation may be about 300 nm to about 600 nm.

In at least some embodiments, the wavelength of the first radiation may be about 350 nm to about 430 nm In at least some embodiments, a primary wavelength of the second radiation may be about 440 nm.

In at least some embodiments, the second phosphor may be excited by the second radiation In at least some embodiments, a wavelength of the third radiation may be about 500 nm to about 700 nm.

In at least some embodiments, a primary wavelength of the third radiation may be about 570 nm.

In at least some embodiments, the method may further comprise: providing a holder having a containing space; and disposing the UV LED chip in the containing space of the holder.

In at least some embodiments, the method may further comprise forming a phosphor layer on the UV LED chip. The phosphor layer may comprise the first phosphor and the second phosphor.

In at least some embodiments, the method may further comprise: filling the first phosphor and the second phosphor in the containing space such that the UV LED chip is wrapped by the first phosphor and the second phosphor.

In at least some embodiments, the second phosphor may be represented by the formula of $MSiO_4$:R or $MSi(OCl)_4$:R, and M may be at least one II-group element selected from a group consisting of Ca, Sr, and Ba, and R may be Eu ion.

In at least some embodiments, the first phosphor and the second phosphor may be conformally formed on a light-emitting surface of the UV LED chip.

In at least some embodiments, the phosphor layer may be conformally formed on the UV LED chip.

In at least some embodiments, the UV LED chip may include two electrodes electrically connected to the holder individually.

The aforesaid objectives, features and advantages of the present invention are further described in the following paragraphs with some embodiments.

DETAILED DESCRIPTION OF THE PREFERRED EMBODIMENT

Figure 1:
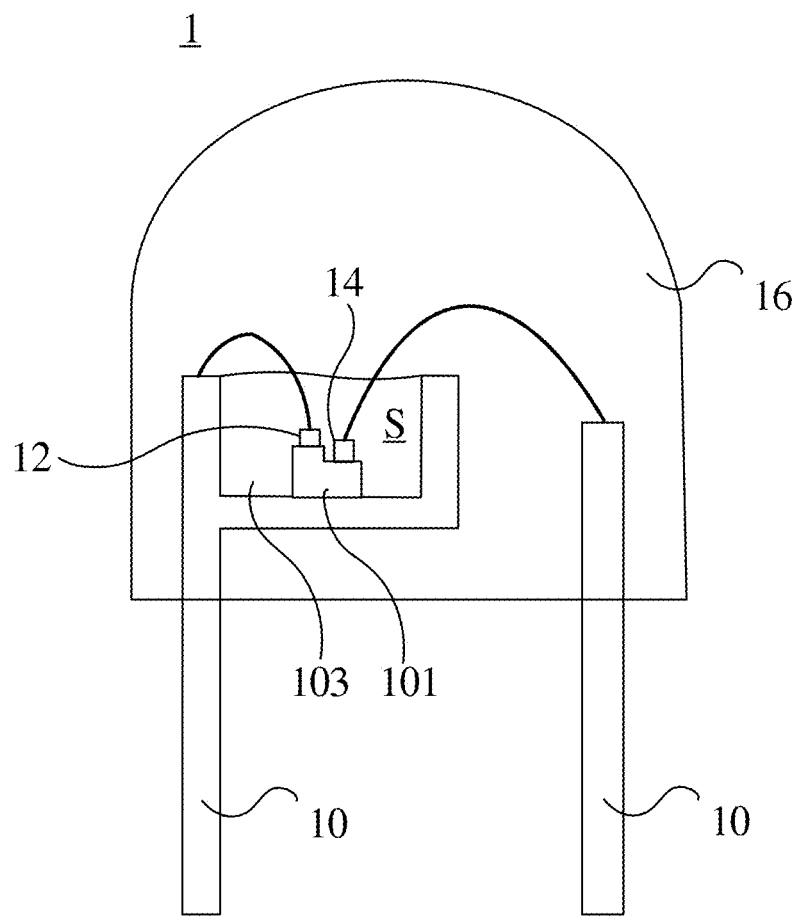
FIG. 1 is a light emitting device of an embodiment according to the present invention.

The following will specifically describe some embodiments of the present invention with the aid of figures. However, the present invention may be embodied in other embodiments without departing from the spirit of the present invention and should not be limited to the embodiments described in the specification. Moreover, the size of each element and area in the figures may be exaggerated and not drawn to real scale for clarity.

The white-light emitting device of the present invention comprises an UV LED chip for generating a first radiation; a first phosphor being composed of $Zn(C_3N_2H_4)_2$ powders, wherein the first phosphor is excited by the first radiation to transform a part of the first radiation into a second radiation having a longer wavelength; and a second phosphor, which is excited by the first radiation and/or the second radiation to generate a third radiation; and the third radiation is then mixed with the first radiation and/or the second radiation to generate a white light.

The first radiation provided by the UV LED chip may be any UV light that can excite the first phosphor to generate the second radiation. For example, the first radiation may be an UV light having a wavelength of about 350 nm to about 430 nm.

The second radiation, generated when the first phosphor is excited by the first radiation, is a blue light having a wavelength of about 300 nm to about 600 nm. In some embodiments of the present invention, the primary wavelength of the second radiation is about 440 nm.

The third radiation may be any yellow light that can be mixed with the first radiation and/or the second radiation to obtain the desired white light. In some embodiments of the present invention, the third radiation is generated when the second phosphor is excited by the second radiation and has a wavelength of about 500 nm to about 700 nm. The primary wavelength of the third radiation is about 570 nm.

Furthermore, in some embodiments of the light emitting device of the present invention, the color temperature of the provided white light is about 6,000K to about 7,500K.

The second phosphor useful in the present invention may be any phosphor that can be excited by the first radiation or the second radiation to generate the third radiation, which can be mixed with the first radiation or the second radiation to generate the white light. In general, the second phosphor comprises the following: (i) one or more elements selected from a group consisting of Be, Ma, Ca, Sr, and Ba; (ii) one or more elements selected from a group consisting of C, Si, Ge, Sn, Ti, Zr, and Hf; and (iii) an activator selected from rare earth elements (such as europium (Eu)) for improving the light emitting efficiency. For example, the second phosphor may be represented by the formula of $MSiO_4$:R or $MSi(OCl)_4$:R, wherein M is one or more II-group elements selected from a group consisting of Ca, Sr, and Ba, and R is Eu ion, but not limited thereto. The second phosphor, for example, may be $(SrBa)_2SiO_4$:$Eu^{2+}$ or $(SrBa)_2Si(OCl)_4$:$Eu^{2+}$, wherein $(SrBa)_2SiO_4$:$Eu^{2+}$ is used in some embodiments of the present invention.

The mixing weight ratio of the first phosphor and the second phosphor may be optionally adjusted to obtain the desired white light. In general, the mixing weight ratio of the first phosphor and the second phosphor is about 1:2 to about 1:6. In some embodiments of the present invention, the mixing weight ratio of the first phosphor and the second phosphor is about 1:4. The resultant phosphor mixture is blended with a silica gel in a weight ratio of about 0.25:1, for example, and the resultant blend provides a phosphor layer 103.

The following will further describe the white-light emitting device of the present invention with the aid of FIG. 1.

FIG. 1 illustrates a white-light emitting device 1 comprising a holder 10, an UV LED chip 101, a phosphor layer 103 and a packaging layer 16. The phosphor layer 103 is formed by mixing the first phosphor and the second phosphor in a proper ratio, and then blending the resultant mixture with the packaging resin material. The holder 10 has a containing space S, while the UV LED chip 101 is placed in the containing space S. The phosphor layer 103 is filled in the containing space S, while the UV LED chip 101 is wrapped by the phosphor layer 103. The phosphor layer 103 is not limited to the figure, and the phosphor layer 103 may be conformally formed on the UV LED chip 101. Furthermore, the UV LED chip 101 has a first electrode 12 and a second electrode 14 electrically connected to the holder 10 to provide power for the UV LED chip 101. The packaging layer 16 covers the phosphor layer 103 and a part of the holder 10. For example, the material of the packaging layer 16 may be epoxy resin.

The present invention also provides a method for preparing the aforesaid white-light emitting device. The method comprises the following: providing an UV LED chip for generating a first radiation; providing a first phosphor, which is an organic metal complex $Zn(C_3N_2H_4)_2$ powder; providing a second phosphor; and mixing the first phosphor and the second phosphor. The first phosphor is excited by the first radiation to generate a second radiation; the second phosphor is excited by the first radiation and/or the second radiation to generate the third radiation; and the third radiation is mixed with the first radiation and/or the second radiation to generate a white light. The characteristics and the selecting conditions of the first phosphor, the second phosphor and the UV LED chip are described above.

The first phosphor of the present invention may be prepared by any suitable method, such as a hydrothermal method, a solid-gaseous sintering method, a sol-gel method, a direct reaction method, or an organic metal thermal decomposition method. In one embodiment, the first phosphor is prepared by the hydrothermal method. The hydrothermal method uses water as a medium and generates a pressure in a sealed reactor by applying a suitable temperature to perform the reaction. First, the reactant and water are placed in a sealed reactor. After fastening and sealing the reactor, it is placed in a heating furnace for heating to perform the reaction. The temperature used is usually ranging from about 130° C. to about 250° C. One advantage of the hydrothermal method is that the crystal powders may be obtained directly without high-temperature sintering, and therefore, the grinding step may be omitted and the impurities produced thereby may also be excluded. The particle size of the resultant powders is usually about few microns to about several tens of nanometers, and the resultant powders usually have advantages such as good crystallization, low aggregation, high purity, narrow particle size distribution, and controllable topography in most situations.

Similarly, the aforesaid proper known method also may be used to prepare the second phosphor of the present invention. For example, a silicate type phosphor may be prepared by the solid sintering method as follows: a carbonate (such as $BaCO_3$, $SrCO_3$) is mixed with silicon dioxide and an optional metal chloride (such as $EuCl_2$, for providing the activator); a high-temperature sintering step is then performed, i.e., the resultant mixture is placed in a crucible and heated to a temperature for dissolving the carbonate; a reductive gas is subsequently introduced into the crucible and it is heated to a higher temperature; the resultant product, along with the crucible, is placed into a solution (such as acetic acid solution), and then is dried to obtain the desired phosphor powders.

The white-light emitting device of the present invention may be prepared by any suitable method. For example, in reference to FIG. 1 again, the UV LED chip 101 is fixed in the containing space S of the holder 10, and then the mixture containing the first phosphor and the second phosphor is filled in the containing space S as the phosphor layer 103, wherein the UV LED chip 101 is electrically connected to the holder 10 through the first electrode 12 and the second electrode 14. The packaging layer 16 is then formed by using any suitable packaging method and packaging material (such as epoxy resin), and the white light LED 1 shown in FIG. 1 is obtained thereby. The detailed operation is described in the following embodiment.

The present invention will be further described with the specific embodiment.

EXAMPLES

Preparation of Phosphor

The first phosphor was prepared by the following steps: about 0.6 g of imidazole (IMZ) compound, about 1.151 g of hydrated zinc acetate ($Zn(NO_3)_2 \cdot 4H_2O$), and 80 ml of dimethyl formamide (DMF) were placed in a sealed reactor; the hydrothermal method was performed to prepare the first phosphor, wherein the temperature was raised to about 130° C. with a temperature raising rate of about 5° C./minute; the temperature was substantially held for about 24 hours and then naturally dropped to room temperature; a drying process was subsequently performed; the solvent was initially removed to produce an organic metal complex $Zn(C_3N_2H_4)_2$ crystal and the resultant crystal was then placed in a 85° C. oven under a vacuum condition for drying for 24 hours to prepare organic metal complex $Zn(C_3N_2H_4)_2$ powders.

Measurement of Light Emitting Spectrum

Figure 2A:
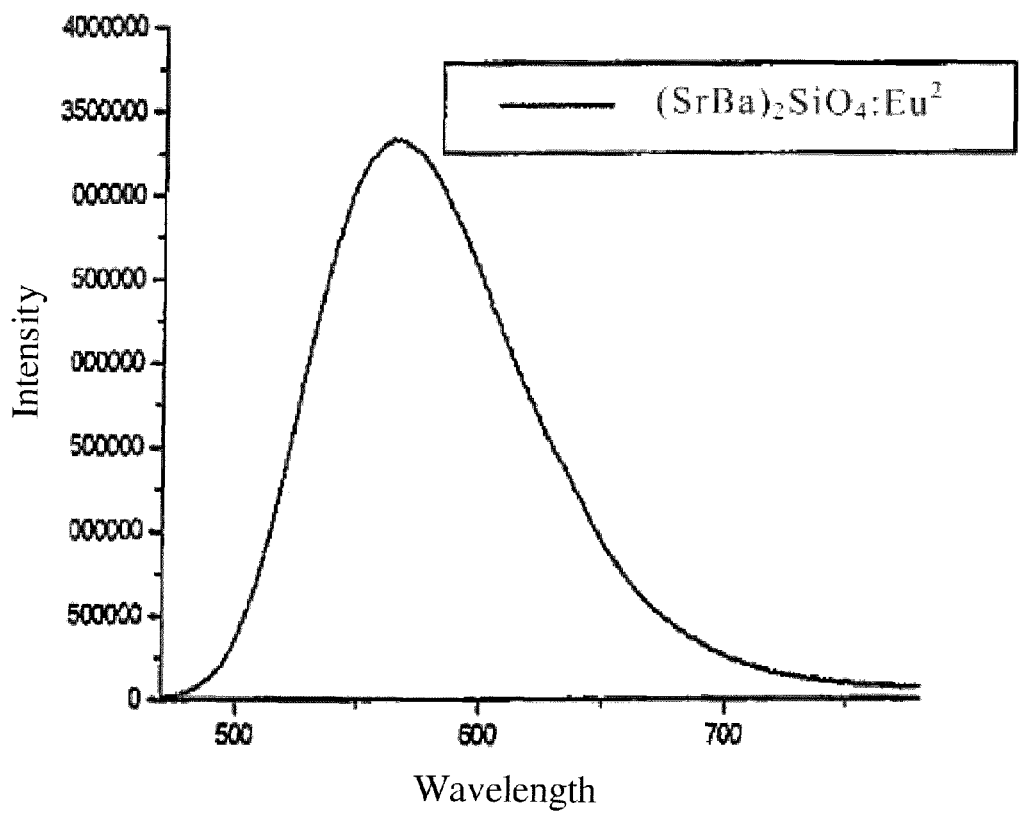
FIG. 2A is a light emitting spectrum of $(SrBaEu)_2SiO_4$ powders excited by the UV light.
Figure 2B:
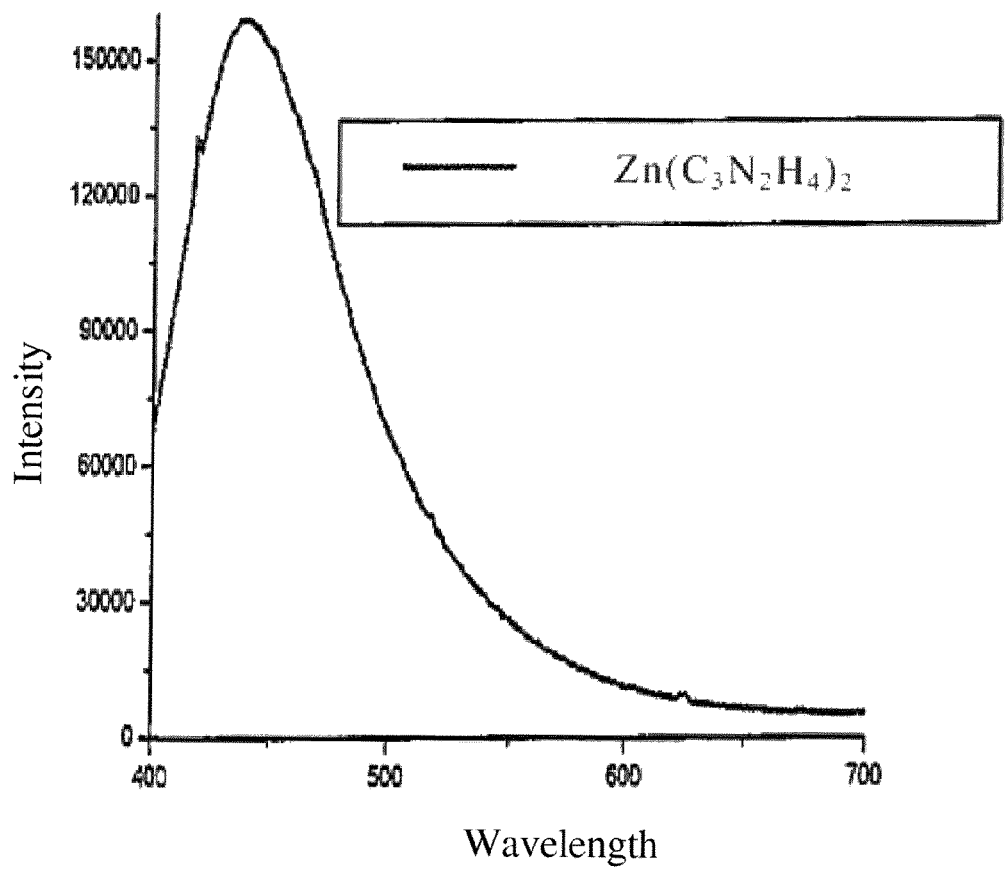
FIG. 2B is a light emitting spectrum of organic metal complex $Zn(C_3N_2H_4)_2$ powders according to the present invention excited by the UV light.
Figure 3:
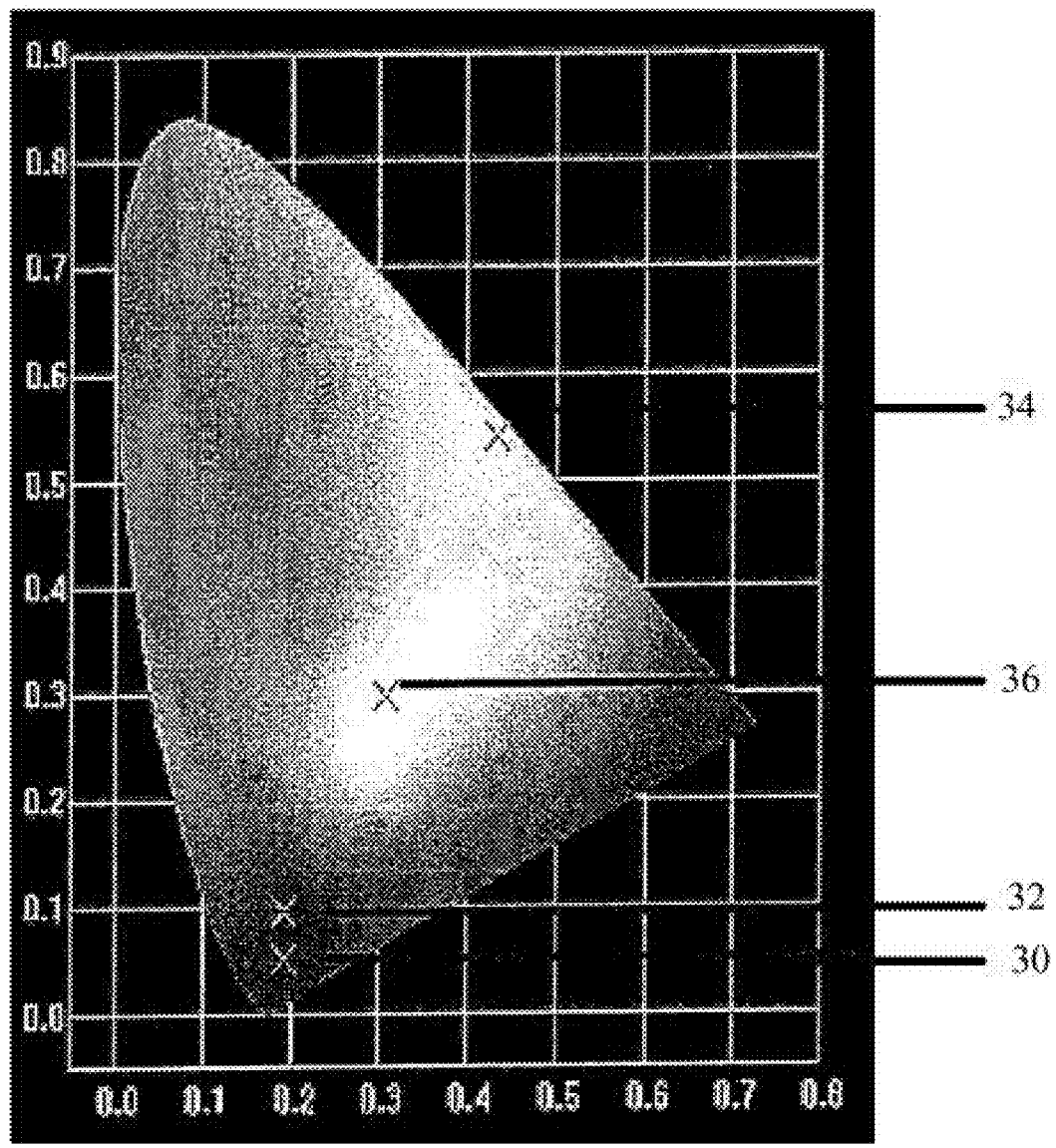
FIG. 3 is a CIE coordinate diagram.

The UV LED chip having a primary wavelength of about 350 nm to about 430 nm was used as an exciting source to excite the $(SrBa)_2SiO_4$:$Eu^{2+}$ powders and the organic metal complex $Zn(C_3N_2H_4)_2$ powders individually. The resultant light emitting spectrums are shown in FIG. 2A and FIG. 2B, respectively. Referring to the figures, the first phosphor excited by the UV LED chip could generate a blue fluorescence, while the second phosphor excited by the UV LED chip could generate a yellow fluorescence. As shown in FIG. 3, the data of the aforesaid light emitting spectrums were transferred into the CIE coordinates of the phosphors through the formula of CIE coordinate diagram established by the International Commission on Illumination in 1931, wherein the number 30 represents the CIE coordinate of the UV LED chip, the number 32 represents the CIE coordinate of the first phosphor, and the number 34 represents the CIE coordinate of the second phosphor.

Preparation of Light Emitting Device

The white light emitting device 1 shown in FIG. 1 used the UV LED chip 101 having a primary wavelength of about 350 nm to about 430 nm. The phosphor layer 103 used therein was prepared by the following steps: the organic metal complex $Zn(C_3N_2H_4)_2$ powders were mixed with $(SrBaEu)_2SiO_4$ powders in a weight ratio of about 4:1; the resultant mixture was then mixed with silica gel; and epoxy resin was used as the material of the packaging layer 16.

The holder 10 was connected to a circuit board. An energizing test was performed, and the color temperature and the CIE coordinate obtained thereby were recorded in Table 1 and marked in FIG. 4 as number 36 for its coordinate position.

TABLE 1

|  | Color Temperature (K.) | Luminance Intensity (mcd) | CIE Coordinate (X-axis) | CIE Coordinate (Y-axis) |
| --- | --- | --- | --- | --- |
| Example | 7115 | 19.6 | 0.309 | 0.295 |

It is known from Table 1 and the CIE coordinate 36 in FIG. 3 that the white-light emitting device of the present invention can indeed provide a white light source.

Given the above, the white-light emitting device of the present invention can efficiently provide the white light source. Because only two phosphors are used in the present invention, the cost is cheaper and the technique of adjusting the ratio of phosphors to obtain the white light is much easier.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A method for preparing a white-light emitting device, comprising:
   providing an ultraviolet (UV) light-emitting diode (LED) chip that generates a first radiation;
   providing a first phosphor and a second phosphor; and
   mixing the first phosphor and the second phosphor;
   wherein:
      the first phosphor is composed of $Zn(C_3N_2H_4)_2$ powder and generates a second radiation when excited by the first radiation;
      the second phosphor generates a third radiation when excited by either or both of the first radiation and the second radiation; and
      the third radiation is mixed with either or both of the first radiation and the second radiation to generate a white light.

2. The method of claim 1, wherein the $Zn(C_3N_2H_4)_2$ powder is prepared by a hydrothermal method, a solid-gaseous sintering method, a sol-gel method, a direct reaction method, or an organic metal thermal decomposition method.

3. The method of claim 2, wherein the $Zn(C_3N_2H_4)_2$ powder is prepared by the hydrothermal method at about 130° C. to about 250° C.

4. The method of claim 1, wherein the second phosphor comprises:
   at least one element selected from a group consisting of Be, Mg, Ca, Sr, and Ba;
   at least one element selected from a group consisting of C, Si, Ge, Sn, Ti, Zr, and Hf; and
   an activator selected from rare earth elements.

5. The method of claim 4, wherein the activator comprises europium (Eu) ion.

6. The method of claim 4, wherein the second phosphor is represented by the formula of $MSiO_4$:R or $MSi(OCl)_4$:R, and wherein M is at least one II-group element selected from a group consisting of Ca, Sr, and Ba, and R is Eu ion.

7. The method of claim 6, wherein the second phosphor comprises $(SrBa)_2SiO_4$:$Eu^{2+}$ or $(SrBa)_2Si(OCl)_4$:$Eu^{2+}$.

8. The method of claim 4, wherein the second phosphor is prepared by a hydrothermal method, a chemical synthesis method, a solid-gaseous sintering method, a sol-gel method, a direct reaction method, or an organic metal thermal decomposition method.

9. The method of claim 1, wherein a weight ratio of the first phosphor and the second phosphor is in a range from about 1:2 to about 1:6.

10. The method of claim 9, wherein the weight ratio of the first phosphor and the second phosphor is about 1:4.

11. The method of claim 1, wherein a color temperature of the white light is about 6,000K to about 7,500K.

12. The method of claim 1, wherein a wavelength of the first radiation is about 350 nm to about 430 nm.

13. The method of claim 1, wherein a wavelength of the second radiation is about 300 nm to about 600 nm.

14. The method of claim 13, wherein a primary wavelength of the second radiation is about 440 nm.

15. The method of claim 1, wherein a wavelength of the third radiation is about 500 nm to about 700 nm.

16. The method of claim 15, wherein a primary wavelength of the third radiation is about 570 nm.

17. The method of claim 1, further comprising:
   providing a holder having a containing space; and
   disposing the UV LED chip in the containing space of the holder.

18. The method of claim 17, further comprising:
   forming a phosphor layer on the UV LED chip, wherein the phosphor layer comprises the first phosphor and the second phosphor.

19. The method of claim 18, wherein the UV LED chip has two electrodes electrically connected to the holder individually.

20. The method of claim 17, wherein the phosphor layer is conformally formed on the UV LED chip.

* * * * *